THYRISTOR WITH PARTICULAR DOPING

Filed July 28, 1966 3 Sheets-Sheet 1

United States Patent Office 3,513,363
Patented May 19, 1970

3,513,363

THYRISTOR WITH PARTICULAR DOPING

Adolf Herlet, Pretzfeld, Germany, assignor to Siemens Aktiengesellschaft, Erlangen, Germany, a corporation of Germany Filed July 28, 1966, Ser. No. 568,640
Claims priority, application Germany, July 30, 1965, S 98,547
Int. Cl. H01l 11/10
U.S. Cl. 317—235 8 Claims

ABSTRACT OF THE DISCLOSURE

Described is a semiconductor controlled rectifier for power current, comprising a substantially monocrystalline silicon body having four sequential regions of alternately opposed types of conductivity and having in one of the two inner regions a substantially uniform dopant concentration lower than the dopant concentration in each of the three other regions. This one inner region has a thickness of 200 to 300 microns and a dopant concentration of $2.5 \cdot 10^{13}$ to $1.5 \cdot 10^{14}$ atoms per cm.$^3$.

My invention relates to semiconductor controlled rectifiers, also called thyristors, and the like controllable semiconductor devices.

Such devices, being of pnpn type, have an essentially monocrystalline semiconductor body, for example of silicon, which comprises four sequential regions of alternately opposed type of conductivity. The two outer regions, generally of high dopant concentration, are called "emitters," the two inner regions, generally of lesser dopant concentration, are called "bases." Attached to one of the inner regions, frequently within a recess of the adjacent outer region, is a contact electrode designated as gate or firing electrode because it permits passing a current through the p-n junction formed of this inner region with the adjacent outer region to thereby fire the thyristor, thus switching it from the substantially non-conducting (closed) to the conducting (open) state.

It is a main object of my invention to devise a thyristor or other controllable semiconductor device which exhibits a highest feasible blocking ability in the closed state while its forward voltage, when in the open state, is minimized to relatively low values.

The invention is predicated upon the recognition that the dimensions and the dopant concentrations of the above-mentioned regions as well as the spacial distribution of the dopant concentrations and the lifetime of the charge carriers determine essentially the entire complex of all electrical properties of the thyristor, such as the blocking (peak inverse) voltage, the trigger or firing voltage, the forward conductance characteristic and others.

According to a prerequisite of my invention, I provide a thyristor or other controllable semiconductor device for power current, having an essentially monocrystalline body of silicon with a pnpn or npnp layer sequence, whose first inner region has a substantially constant dopant concentration over the entire layer thickness, which concentration is lower than that in the second inner region and in the two outer regions. According to an essential feature of the invention, the first inner region, namely the one having the lowest dopant concentration, has a thickness of 200 to 300 microns, and its substantially uniform dopant concentration is in the range of $$2.5 \cdot 10^{13} \text{ to } 1.5 \cdot 10^{14}$$

atoms per cm.$^3$.

These and further features of the invention will be described with reference to the accompanying drawing showing by way of example a thyristor according to the invention in which the above-mentioned first inner region has n-type conductivity.

Figure 1:
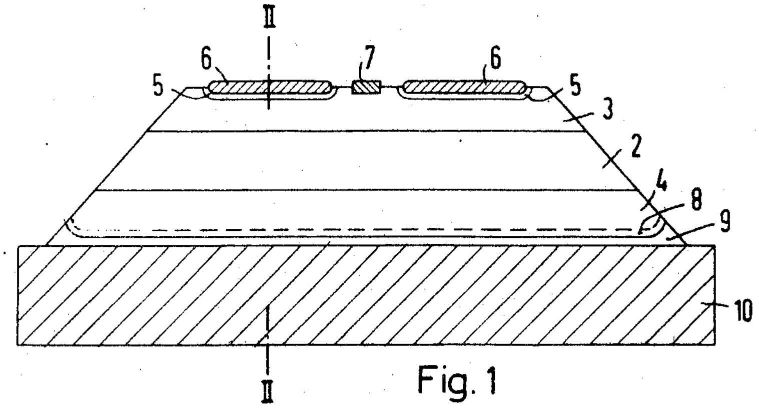
FIG. 1 is a schematic cross section of the semiconductor device.

The device illustrated in FIG. 1 is essentially constituted by a monocrystalline circular body of silicon. Denoted by 2 is the above-mentioned first inner region whose dopant concentration has the lowest value in comparison with all of the other regions, this concentration being nearly constant over the entire thickness of the region 2 which, for example, has n-type conductivity. Adjacent to one of the flat sides of the first inner region 2 is a p-type second inner region 3. A p-type region 4 is located on the other flat side of the first inner region 2 and forms an inner portion of a p-type outer region. The two regions 3 and 4 may be produced by diffusion, alloying or any of the techniques known for such purposes.

For example, a flat and disc-shaped core wafer 2 of n-type silicon may be used as starting material, and further silicon of p-type conductivity may be precipitated upon the wafer 2 by pyrolytic dissociation from a gaseous silicon compound, for example $SiHCl_3$ or $SiCl_4$, in mixture with a carrier-gas and reaction-gas, for example $H_2$. As a result, the core wafer is thickened by the layers 3 and 4. This epitaxial precipitation process permits arbitrarily varying the added quantitative proportions of doping substance during the pyrolysis, thus obtaining any desired change of the concentration density in the direction of the layer thickness. The same process is applicable for depositing the fourth layer, namely by adding a donor substance to the gaseous mixture being dissociated, so that the resulting outer layer assumes n-type conductance.

According to another conventional technique, acceptors are diffused from all sides into an n-type silicon monocrystalline wafer to convert a surface layer to p-type conductivity. When removing the marginal zone of such a diffusion-treated wafer, there results a pnpn layer sequence whose n-type inner layer 2 is formed by the original monocrystalline silicon and is bordered on both flat sides by p-type layers 3 and 4. In contrast to the precipitation process with whose aid, as mentioned, any desired concentration profile can be obtained, the diffusion process normally is limited to the natural laws of the diffusion phenomena. However, by suitably varying the diffusion parameters and by employing several doping substances of respectively different diffusion constants, the concentration profile can also be modified.

The n-type outer region 5, aside from being producible by the above-described epitaxial process, can also be produced by alloying a donor-containing metal into the crystal. Preferably employed for this purpose is a gold foil with an antimony content of about 1%, the remainder being all of gold. After heating the silicon wafer with the gold-antimony foil placed upon it, above the eutectic temperature (about 370° C.) up to about 700° C., and permitting the crystal to cool down to normal room temperature, there occurs a recrystallization layer 5 which exhibits a high donor concentration and forms an n-type emitter. The resulting gold-silicon alloy, consisting of the eutectic, forms a contact electrode 6 of the n-type emitter 5. The shape and thickness of the electrode 6, after complete in-alloying of the gold foil, are definitely determined by the original shape and thickness of the foil. For example and as shown, the foil and the resulting electrode 6 are ring-shaped. Consequently, the recrystallization layer 5 also has annular shape. An annular shape can also be obtained with the above-described epitaxial process.

Within the opening of the ring-shaped recrystallization layer 5, the p-conducting region 3 extends up to the outer surface of the crystal where the region 3 is provided with a barrier-free contact, for example by in-alloying of a boron-containing gold foil. The alloy resulting from the gold foil and from a corresponding quantity of the adjacent silicon, produces a central base electrode 7 of relatively small area which serves for controlling the thyristor.

Alloyed into the opposite flat side of the disc-shaped monocrystal, namely into the p-type outer region 4, is a metal which contains acceptors, for example a foil of aluminum, and which preferably covers the entire flat face of the crystal on this side. This produces a highly doped p-conducting recrystallization layer 8 which forms an outermost component portion of the p-type outer region and is covered by a contact electrode 9 formed by a eutectic aluminum-silicon alloy.

The layers 8 and 4 jointly form the p-emitter. The alloying of the contact electrode 6 for the n-emitter and of the base contact 7, as well as the alloying of contact electrode 9 for the p-emitter, are preferably performed as a single processing step which, if desired, may simultaneously serve to alloy a supporting or bracing plate 10 of molybdenum to the contact electrode 9.

Figure 2:
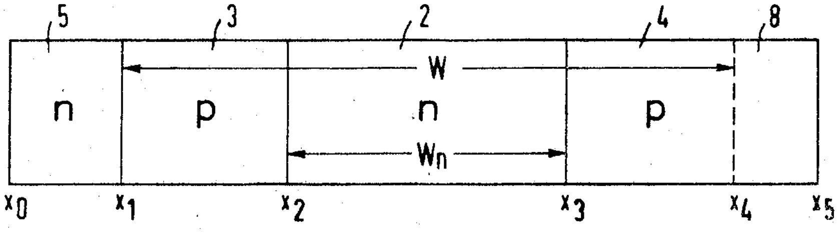
FIG. 2 is explanatory, representing diagrammatically the sequence of differently doped regions and identifying the direction of local coordinates, the layer sequence corresponding to that of a cross section taken along the line II—II in FIG. 1.

It will be seen that the sequence of alternately opposed type of conductivity in the regions along a section in the plane denoted by II—II in FIG. 1 corresponds schematically to the npnp sequence represented in FIG. 2.

Figure 3:
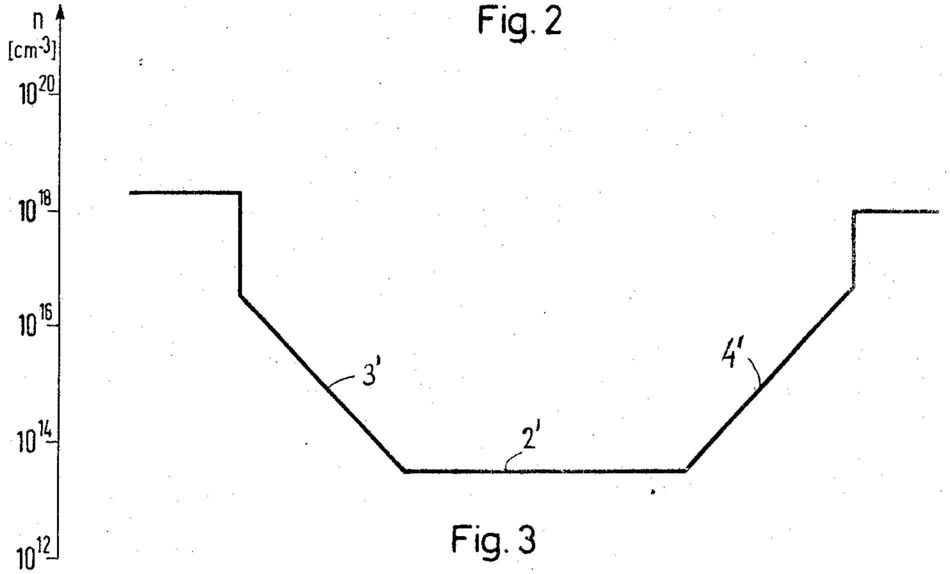
FIG. 3 is a graph indicative of the dopant concentration in the individual regions according to FIG. 2.

FIG. 3 exhibits the corresponding dopant concentration profile in the horizontal direction of the layer thicknesses as shown in FIG. 2. The above-mentioned core forms the n-type inner region 2 (FIG. 2) having a substantially uniform dopant concentration 2' (FIG. 3) of about $5\cdot10^{13}$ cm.$^{-3}$ and a thickness $W_n$. This first inner base region is bordered on one side by a p-n junction $X_2$ which, when the thyristor is under operating voltage, effects blocking in the inverse direction. At the other side the base region 2 is bordered by a p-n junction $X_3$ which effects blocking in the forward direction of the thyristor. Located adjacent to the junctions $X_2$ and $X_3$ are the p-type regions 3 and 4 in which the acceptor concentrations 3', 4' in the vicinity of the p-n junctions have a value of approximately $5\cdot10^{13}$ cm.$^{-3}$ and increases outwardly by several powers of ten, for example up to a value somewhat above $10^{17}$ cm.$^{-3}$ which is reached at the p-n junction $X_1$ or in the vicinity of the layer 8.

The viewpoints for selecting the layer thickness as well as the amount and profile of the dopant concentration in the individual regions, so as to optimize the forward and inverse values of the thyristor, will now be described more in detail.

Figure 4:
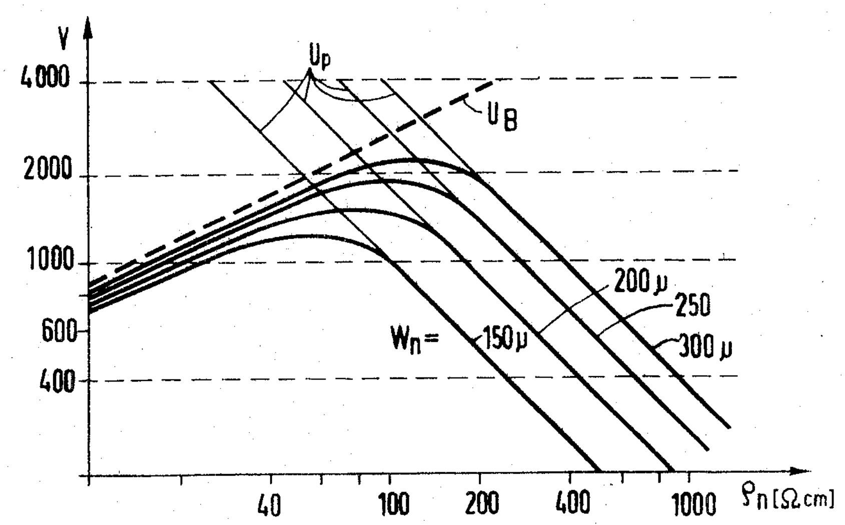
FIG. 4 is a graph representing the blocking ability of thyristors in dependence upon thickness and specific resistivity of the first n-type inner region.

The graph of FIG. 4 represents the blocking ability of thyristors having a uniformly doped, for example n-type, inner region versus the specific resistance $\rho_n$ and the thickness $W_n$ of this inner region. The abscissa of the diagram denotes resistivity in ohm·cm., the ordinate indicates voltage. Also shown in FIG. 4 are the curves of the corresponding punch-through voltage $U_P$, as well as the breakdown voltage $U_B$. The punch-through voltage $U_P$ is the voltage which, when applied to a p-n junction in the blocking direction, causes the space charge zone to completely spread over one of the adjacent regions, in the present example over the n-type region. The breakdown voltage $U_B$ is the voltage at which the electrical field at the p-n junction becomes so large that flashover will occur. The breakdown voltage $U_B$ depends upon the dopant concentration in the vicinity of the p-n junction, and consequently, in the present example, upon the dopant concentration in the n-type inner region and in the adjacent p-type regions. As mentioned, in preferred embodiments of thyristors according to the invention, these p-type regions (3, 4 in FIGS. 1, 2) have a dopant concentration that increases from the inner p-n junction outwardly by several powers of ten. This increase in concentration influences the blocking ability in such a way that the breakdown voltage $U_B$ increases with a decreasing gradient of dopant concentration. In the present example, it is favorable to have the concentration in the p-type outer layer increase approximately exponentially from the vicinity of the p-n junction. For example, the acceptor concentration may increase by the factor $e=2.7$ along a distance of 7 to 13 microns. A distance value of 10 microns results in the particular breakdown curve $U_B$ shown in FIG. 4.

As will be seen from FIG. 4, the blocking ability increases with an increase in thickness $W_n$ (see FIG. 2). However, as will be explained, it does not appear upon a first consideration to make technological sense if the thickness $W_n$ is increased beyond 300 microns, because this would make the forward voltage drop undesirably large, this voltage drop being decisive for the operational power loss normally occurring in the thyristor. For a thickness $W_n$ in the range of 200 to 300 microns, a specific resistance between 40 and 120 ohm-cm. is preferably chosen.

The foregoing considerations concerning the blocking ability apply to both p-n junctions $X_2$ and $X_3$ bordering the n-type inner region and hence to the blocking ability in both the inverse direction and forward direction. In a preferred embodiment of the invention, therefore, the course or profile of the acceptor concentration in the p-conducting regions is made symmetrical to each other, as is the case in the illustrated embodiment.

As mentioned, a further increase in blocking ability by increasing the layer thickness $W_n$ beyond 300 microns encounters the objection of an excessive increase in power losses occurring in the semiconductor device for a given or rated current intensity. This is because in the condition of forward conductance (thyristor open) the middle zone W (FIG. 2), which in the illustrated embodiment comprises the p-type inner region 3 and the n-type inner region 2, as well as the relatively weakly doped portion 4 of the p-type outer region, must be flooded by the charge carriers of both polarities. The sources of the charge carriers are the outer regions, namely the p-emitter 4 and the n-emitter 5. Consequently, too low a dopant concentration in these source regions would result in insufficient flooding and consequently in undesirably high forward conductance voltage. This makes it preferable to select for the outer n-type region 5 a dopant concentration of about $10^{18}$ cm.$^{-3}$ or more. A similarly high concentration is preferably provided in an outermost component portion 8 of the p-type outer region 4. The production of these high concentration values in the two outermost regions can be effected, as described, by the conventional alloying or epitaxial method.

However, the high dopant concentration of the outer regions is not alone sufficient for satisfactorily flooding the middle zone W, i.e. for securing a sufficiently low forward voltage drop. It is also necessary that the current carriers, by virtue of their diffusion length L, be capable of uniformly flooding the entire middle zone W.

Figure 5:
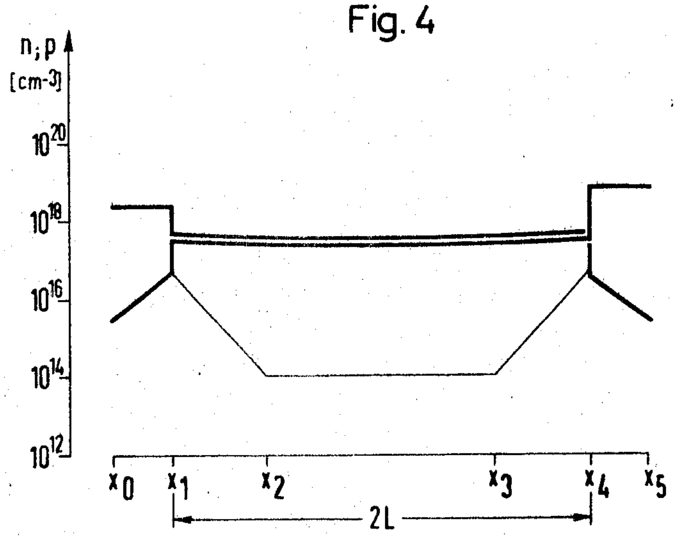
FIGS. 5 and 6 are explanatory graphs relating to the concentrations of the charge carriers in the state of forward conductance of the semiconductor device at high values of injection.
Figure 6:
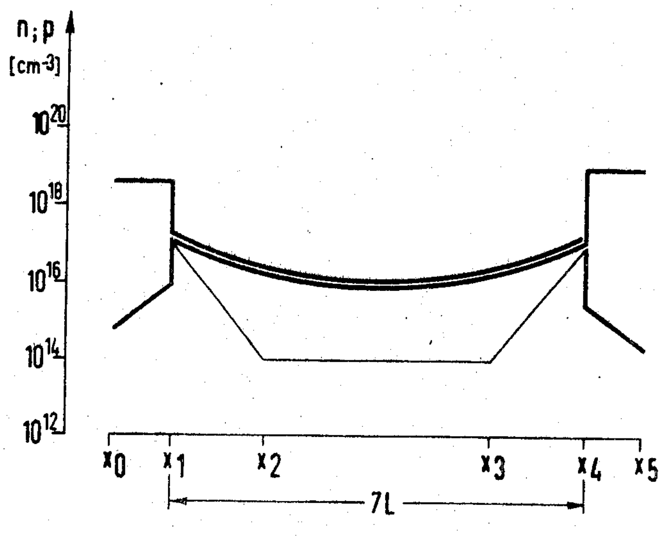

The diffusion length L indicates along which distance the charge carriers of one polarity decrease in their direction of motion by the factor $e=2.7\ldots$, the diffusion length being the same for both types of carriers (electrons and holes) at high values of injection (10 to 200 amps/cm.$^2$). The requirement concerning the diffusion length L of the charge carriers will be elucidated with reference to FIGS. 5 and 6. Both graphs represent the charge carrier concentrations in the different regions plotted over the thickness of these regions. FIG. 5 relates to a large diffusion length and FIG. 6 to a short diffusion length. In FIG. 6, a definite reduction of the charge carrier concentration is observable in the middle zone whose thickness W amounts to seven times the diffusion length L. In FIG. 5, the diffusion length is much greater, the thickness W being only twice the diffusion length; and no appreciable reduction in charge carrier concentration is apparent.

Figure 7:
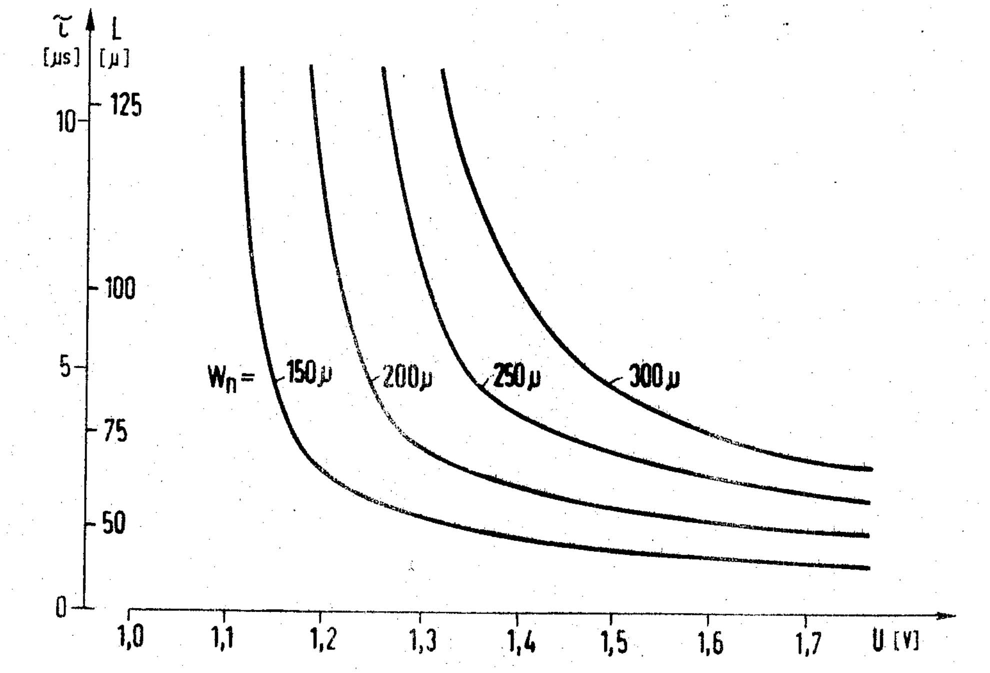
FIG. 7 is an explanatory graph representing the forward conductance voltage of the semiconductor device in dependence upon the lifetime of the charge carriers.

FIG. 7 relates to four thyristors having respectively different base thicknesses $W_n$, but otherwise the same dopant concentrations and area sizes. Shown in the diagram is the forward voltage $U_D$ (indicated on the abscissa) in dependence upon the diffusion length L or the lifetime $\tau$ of the charge carriers (ordinate). The thickness of the flooded p-regions is 50 microns in each of the four thyristors, so that the thickness W (see FIG. 2) is 100 microns larger than the value of $W_n$ apparent from FIG. 7. The curves shown in FIG. 7 apply to a current density of 200 a./cm.$^2$ relating to the area of the smaller one of the two emitters, this being the n-emitter 5 in FIG. 1. It will be seen from FIG. 7 that the forward voltage increases with a decrease in diffusion length L of the charge carriers, all other conditions being the same. It is further apparent that for a given diffusion length the forward voltage increases with an increse in thickness $W_n$ or W. The increase in forward voltage, however, becomes particularly pronounced if the thickness W of the entire middle zone exceeds about four times the diffusion length. Consequently, the choice of the thickness $W_n$ or W is upwardly limited by the diffusion length L and it is preferable to choose for thickness W a value smaller than four times the diffusion length L. It is further desirable to take care of a greatest possible diffusion length by employing a highly pure starting material and suitable production methods.

In the copending application of K. Raithel, Ser. No. 352,599, filed Mar. 17, 1964, assigned to the assignee of the present invention, there is described a production method according to which a diffusion process is carried out within a quartz ampoule coated on the inside with silicon monoxide, whereby the desired diffusion length can be achieved by a kind of gettering process. For a thickness $W_n$ of the middle region equal to approximately 300 microns and a corresponding thickness W of approximately 400 microns, the diffusion length should be larger than 100 microns, which can be readily achieved with the process just mentioned. It is further advisable to also conduct the alloying process so as to preserve a highest feasible diffusion length. Comprehensive experimentation has shown that this is the case when selecting the alloying temperature in the range between 700° and 750° C.

By means of such methods, diffusion lengths of 100 microns or more are obtainable. Consequently, thyristors according to the invention can be readily produced whose middle zone has a thickness W of 400 microns and whose breakdown voltage is nevertheless smaller than 1.4 v. at a current density of 200 a./cm.$^2$ Although I have so far described my invention in the assumption that the core of the layer sequence is constituted by a uniformly doped n-type inner region, it will be readily understood that the invention is analogously applicable to devices in which the conductivity types p and n are exchanged for each other, resulting in a layer sequence having a p-type core region of lowest dopant concentration and having correspondingly higher concentrations in the other regions, it being only necessary to take into account the higher specific resistivities usually encountered with p-type silicon.

Upon a study of this disclosure, such and various other modifications, including those relating to materials and shape of the particular devices and their component parts, will be obvious to those skilled in the art. Hence, the invention may be given embodiments other than particularly illustrated and described herein, without departing from the essential features of my invention and within the scope of the claims annexed hereto.

I claim:

1. A semiconductor controlled rectifier for power current, comprising a substantially monocrystalline silicon body having four sequential regions of alternately opposed types of conductivity and having in one of the two inner regions a substantially uniform dopant concentration lower than the dopant concentration in each of the three other regions, said one inner region having a thickness of 200 to 300 microns and having a dopant concentration of $2.5\cdot10^{13}$ to $1.5\cdot10^{14}$ atoms per cm.$^3$.

2. In a rectifier according to claim 1, the diffusion length of the charge carriers at a current density of 10 to 200 a./cm.$^2$ being larger than one quarter of the thickness of the middle zone flooded by injected charge carriers at forward conductance, said middle zone comprising said two inner regions and a portion of the one outer region adjacent to said one inner region of the lower and uniform dopant concentration.

3. In a rectifier according to claim 2, said diffusion length being larger than 100 microns.

4. In a rectifier according to claim 1, said other inner region having a dopant concentration which increases from said one inner region in the outward direction by several powers of ten.

5. In a rectifier according to claim 4, the one outer region next to said one inner region having adjacent to said one inner region a portion of lower dopant concentration than in the rest of said one outer region, said dopant concentration in said adjacent portion increasing in the outward direction in a substantially symmetrical relation to the dopant concentration of said other inner region.

6. In a rectifier according to claim 5, said one outer region having remote from said one inner region an outermost portion in which the dopant concentration is at least about $10^{18}$ atoms per cm.$^3$, and said other outer region having likewise a dopant concentration of at least about $10^{18}$ atoms per cm.$^3$.

7. In a rectifier according to claim 1, said one inner region having n-type conductivity and a specific resistivity of 40 to 120 ohm-cm.

8. In a rectifier according to claim 1, said one inner region having n-type conductivity and a specific resistance of 120 to 360 ohm-cm.

References Cited

UNITED STATES PATENTS

| | | | |
|---|---|---|---|
| 2,980,832 | 4/1961 | Stein | 317—235 |
| 3,209,428 | 10/1965 | Barbaro | 29—25.3 |

JOHN W. HUCKERT, Primary Examiner

M. H. EDLOW, Assistant Examiner

U.S. Cl. X.R.

148—186; 307—284